United States Patent [19]
Harkness et al.

[11] Patent Number: 6,096,483
[45] Date of Patent: Aug. 1, 2000

[54] RADIATION-CURABLE COMPOSITION AND METHOD FOR MANUFACTURING CURED-PRODUCT PATTERNS THEREFROM

[75] Inventors: Brian R. Harkness, Cowbridge, United Kingdom; Mamoru Tachikawa; Kasumi Takei, both of Kanagawa, Japan

[73] Assignee: Dow Corning Asia, Ltd., Tokyo, Japan

[21] Appl. No.: 08/829,774

[22] Filed: Mar. 31, 1997

[30] Foreign Application Priority Data

Mar. 29, 1996 [JP] Japan .................................. 8-077043

[51] Int. Cl.$^7$ ............................. G03C 1/73; G03C 5/56
[52] U.S. Cl. ..................... 430/325; 430/270.1; 430/331; 430/919; 430/920; 430/921; 522/44; 522/55; 522/57; 522/63; 522/65; 522/148
[58] Field of Search ................. 430/270.1, 919, 430/920, 921, 325, 331; 522/44, 55, 57, 59, 63, 65, 148

[56] References Cited

U.S. PATENT DOCUMENTS

| | | | |
|---|---|---|---|
| 4,822,716 | 4/1989 | Onishi et al. | 430/192 |
| 5,141,840 | 8/1992 | Mizutani et al. | 430/281.1 |
| 5,206,117 | 4/1993 | Labadie et al. | 430/325 |
| 5,789,460 | 8/1998 | Harkness et al. | 522/148 |

FOREIGN PATENT DOCUMENTS

| | | | |
|---|---|---|---|
| 0 555 749 A1 | 8/1993 | European Pat. Off. | G03F 7/004 |
| 0610629 | 7/1994 | European Pat. Off. | 322/44 |
| 0 687 718 A1 | 12/1995 | European Pat. Off. | C09D 183/04 |
| 58-174418 | 10/1983 | Japan | C08G 59/68 |
| 6-80879 | 3/1994 | Japan | C08L 83/04 |
| 6-148887 | 5/1994 | Japan | H01L 21/30 |
| 6-273936 | 9/1994 | Japan | H01L 21/30 |

OTHER PUBLICATIONS

Chemistry and Technology of Silicones, 2nd Editions, p. 90, p. 205, p. 397, Walter Noll Academic Press, Inc. (London) Ltd., 1968.

Organosilicon Compounds, p. 200, C. Eaborn, Butterworths Scientific Publications (London), 1960.

Encyclopedia of Polymer Science and Engineering, vol. 9, pp. 97–138, Lithographic Resists, Wiley Interscience (New York), 1985.

S.I. Schlesinger, Polymer Engineering and Science, Jul. 1974, vol. 14, No. 7, p. 513.

G. Smets, A. Aerts, and J. Van Erum, Polymer Journal, vol. 12, No. 9, p. 539, 1980.

Jpn. J. Appl. Phys., vol. 32 (1993) pp. 6052–6058.

S. Hayase, Y. Onishi, K. Yoshikiyo, S. Suzuki, and M. Wada, Journal of Polymer Science: Polymer Chemisrty Edition, vol. 20, p. 3155, 1982.

S. Hayase, T. Ito, S. Suzuki, and M. Wada, Journal of Polymer Science: Polymer Chemistry Edition, vol. 19, p. 2185, 1981.

S. Hayase, Y. Onishi, S. Suzuki, and M. Wada, Macromolecules 1985, 18, p. 1799.

M. R. Winkle, K. A. Graziano, Journal of Photopolymer Science and Technology, vol. 3, 1990, p. 419.

J.F. Cameron, J.M.J. Frechet, J. Am. Chem Soc. 1991, 113, 4303.

J.M.J. Frechet, J.F. Cameron, Polym. Mater. Sci. Eng. 64,55, 1991.

S.K. Weit, C. Kutal, Chem. Mater, 1992, 4, 453–457.

C. Kutal, C.G. Willson, J. Electrochem. Soc., 134, 2280–2285, 1987.

*Primary Examiner*—Bernard Codd
*Attorney, Agent, or Firm*—Sharon K. Severance; William F. Boley

[57] ABSTRACT

The present invention provides a curable composition which comprises (A) a base-generating substance which generates a base when exposed to the action of ultraviolet light, (B) a siloxane polymer which has silicon-hydrogen bonds (Si—H) capable of reacting with hydroxy groups under the effect of the base to form silicon-oxygen bonds (Si—O) and hydrogen molecules ($H_2$), and (C) an acid substance. This composition is cured by irradiation with ultraviolet light. During this ultraviolet irradiation, a mask is placed between a coating film of the composition and the radiation source, and the uncured portions of the composition are dissolved and removed so that a pattern is formed. The residual portions are then heated to produce a pattern-cured product.

24 Claims, No Drawings

RADIATION-CURABLE COMPOSITION AND METHOD FOR MANUFACTURING CURED-PRODUCT PATTERNS THEREFROM

BACKGROUND OF THE INVENTION

This invention pertains to a radiation-curable silicon-containing composition which can be used for example, in the manufacture of insulating films for semiconductor devices and to a method for manufacturing patterns consisting of a cured silicone product and inorganic silicon oxide utilizing said composition.

It is known in the art that hydrogen atoms bonded directly to silicon atoms will react with the hydroxy groups of water, alcohols or silanols, to form hydrogen molecules and silicon-oxygen bonds, Si—O. At high temperatures, this reaction will proceed even without a catalyst however, it is known that the reaction proceeds more readily in the presence of transition metal catalysts such as platinum or palladium; basic catalysts such as alkali metal hydroxides or amines; or Lewis acid catalysts such as tin compounds. Furthermore, it has been proposed that cross-linking reactions involving Si—H and SiOH may be used in room-temperature curing reactions of silicones.

Curing reactions utilizing the effects of radiation, and techniques associated with such reactions, are known in the art. Examples of the curing using the effects of radiation include curing based on crosslinking reactions and curing based on polymerization reactions.

Examples of curing based on crosslinking reactions include curing utilizing photo-dimerization reactions of cinnamic acid compounds, curing utilizing reactions between mercapto groups and olefins, and curing utilizing diazo groups or azide groups as photosensitive groups.

Examples of curing based on polymerization reactions include combining functional groups such as acryloyl groups or methacryloyl groups with polymerization initiators that generate radicals when exposed to radiation, and methods in which cationic polymerization initiators are generated by irradiation with radiation. The cationic polymerization of epoxy groups, lactones or active vinyl groups, is performed using these initiators.

There are also curing methods which use an acid-generating substance that generates an acid when irradiated with radiation, and which cause a cross-linking reaction or polymerization reaction to take place through the catalytic action of the acid produced. For example, Japanese Patent Application Kokai No. 6-80879 discloses methods for manufacturing thin films of silicate glass by combining specified siloxanes with substances that generate acids when exposed to the effects of radiation. Japanese Patent Application Kokai No. 58-174418 discloses techniques for the photo-curing of epoxy resins using aluminum compounds and o-nitrobenzoyloxysilicon compounds. Acid generating substances known in the art include use aryldiazonium salts diaryliodonium salts, triarylsulfonium salts triarylselenium salts, dialkylphenacylsulfonium salts, dialkyl-4-hydroxyphenylsulfonium salts, sulfonic acid esters, iron-allene compounds, and silanol-aluminum complexes.

There are also several methods known in the art in which the curing reaction is effected using a substance which generates a base when irradiated with radiation. Base-generating substances used in such methods include organic and inorganic nitrogen-containing compounds such as o-nitrobenzyl carbamate compounds, metal-amine complexes and 4-(o-nitrophenyl)dihydropyridines. Organic amines, ammonia or quaternary ammonium hydroxides are irradiated with radiation.

In the base-generating methods the base that is generated acts as a catalyst in the cross-linking reaction and an amplifying effect is obtained in the cross-linking reaction even if the intensity of the radiation is low, and unlike the case of radical reactions, there is no oxygen interference. Furthermore, compared to methods which use an acid, methods which use a base are advantageous in that there is little problem of substrate corrosion. However, the application of such methods is extremely limited. For example, EP 0555749 A1 discloses a method in which compositions consisting of a phenol resin, epoxy cross-linking agent and melamine curing agent are cured using a basic catalyst generated.

Japanese Patent Application Kokai No. 6-148887 discloses a method in which polysilsesquioxanes alone, and compositions consisting of polysilsesquioxanes and tetraphenoxysilane are cured. In JP'887 the sensitivity (D50= amount of irradiation producing a residual film rate of 50% in the developing process) is extremely low. Additionally, it appears that curing is attributable to a condensation reaction in which water, alcohols or phenols are produced as by-products, so that there is a large weight reduction accompanying curing.

Japanese Patent Application Kokai 6-273936 discloses a photosensitive resin composition using a siloxane polymer and a base-generating agent, and a pattern forming method using this composition. In JP '936 the sensitivity (D50) is not reported; however, the amount of irradiation is 100 mJ/cm$^2$ to 300 mJ/cm$^2$ (365 nm), so it appears that the sensitivity is low. Additionally, the curing appears to be based on a condensation reaction in which water or alcohols are produced as by-products, so that curing is accompanied by considerable weight reduction and shrinkage.

In both of the examples mentioned above, it is believed that the extremely low sensitivity is attributable to the characteristics of the condensation reaction itself.

It is an object of the present invention is to provide a silicon-containing composition with good patterning characteristics, which shows little weight reduction or shrinkage accompanying curing, and which has good storage stability It is further an object of the present invention to provide a pattern forming method using said composition.

SUMMARY OF THE INVENTION

The present invention pertains to a curable composition comprising (A) a base-generating substance which generates a base when exposed to the action of ultraviolet light; (B) a siloxane polymer which has silicon-hydrogen bonds capable of reacting with hydroxy groups under the effect of the base to form silicon-oxygen bonds and hydrogen molecules; (C) an acid substance; and (D) optionally a cross-linking agent which has hydroxy groups. This composition is cured by irradiation with ultraviolet light. During this ultraviolet irradiation, a mask is placed between a coating film of the composition and the radiation source, and the uncured portions of the composition are dissolved and removed so that a pattern is formed. The residual portions are then heated to produce a pattern-cured product.

THE INVENTION

In the curable composition the base-generating composition is selected from the group consisting of benzyl carbamate compounds, benzoin carbamate compounds, o-carbamoylhydroxyamines, o-carbamoyloximes, aromatic sulfonamides, alpha-lactams, N-(2-arylethenyl)amides, aryl azide compounds, N-arylformamides and N-substituted 4-(o-nitrophenyl)dihydropyridines. The base-generating substance is included in the curable composition at the rate of 0.01 to 20 wt % based on the overall weight of the composition. If the amount added is too small, the curing reaction will be retarded, and if the amount added is excessively large, the physical properties of the composition prior to curing may be weakened, and the physical properties of the cured composition may be lost. It is preferred that the amount of the base-generating substance that is included in the curable composition be 0.05 to 10 wt % and more preferably 0.1 to 5 wt % based on the overall weight of the composition.

Benzyl carbamate compounds useful herein may be represented by the general formula $ArCHR^2OC(=O)NR^3R^4$ where $R^2$ is selected from the group consisting of a hydrogen atom, an alkyl group and an aryl group; $R^3$ is selected from the group consisting essentially of a hydrogen atom, an aryl group and an alkyl group; $R^4$ is selected from the group consisting of an aryl group and an alkyl group; and Ar indicates an aryl group.

Benzoin carbamate compounds useful here in may be represented by the general formula $ArC(=O)CHArOC(=O)NR^5R^6$ wherein $R^5$ i selected from the group consisting of a hydrogen atom and an alkyl group; $R^6$ is selected from the group consisting of an aryl group and an alkyl group; and Ar indicates an aryl group.

O-carbamoylhydroxyamines compounds useful herein may be represented by the general formula $R^7R^8NOC(=O)NR^9R^{10}$ wherein $R^9$ is selected from the group consisting of a hydrogen atom and an alkyl group; $R^{10}$ is selected from the group consisting of an aryl group and an alkyl group, and $R^7$ and $R^8$ each are selected from the group consisting of H, an alkyl group, an aryl group and an acyl group.

O-carbamoyloximes compounds useful herein may be represented by the general formula $R^{11}R^{12}C=NOC(=O)NR^{13}R^{14}$ wherein $R^{13}$ is selected from the group consisting essentially of a hydrogen atom and an alkyl group; $R^{14}$ is selected from the group consisting essentially of an aryl group and an alkyl group; and $R^{11}$ and $R^{12}$ each are selected from the group consisting essentially of H, an alkyl group and an aryl group.

Aromatic sulfonamides compounds useful herein may be represented by the general formula $ArS(=O)2NR^{15}R^{16}$ wherein $R^{15}$ is selected from the group consisting essentially of a hydrogen atom and an alkyl group; $R^{16}$ is selected from the group consisting essentially of an aryl group and an alkyl group; and Ar indicates a aryl group.

Alpha-lactams compounds useful herein may be represented by the general formula $R^{17}CHC(=O)NR^{18}$ wherein $R^{18}$ is selected from the group consisting essentially of an aryl group and an alkyl group; and $R^{17}$ is selected from the group consisting essentially of an aryl group and an alkyl group.

N-(2-arylethenyl)amides compounds useful herein may be represented by the general formula $R^{19}C(=O)NR^{20}CH=CHAr$ wherein $R^{19}$ is selected from the group consisting essentially of an aryl group and an alkyl group; $R^{20}$ is an alkyl group; and Ar indicates an aryl group.

Aryl azide compounds useful herein may be represented by the general formula $ArN_8$ wherein Ar is selected from the group consisting essentially of an aryl group and a substituted aryl group.

N-arylformamides compounds useful herein may be represented by the general formula $ArNHC(=O)H$ wherein Ar is selected from the group consisting essentially of an aryl group and a substituted aryl group.

The N-substituted 4-(o-nitrophenyl)dihydropyridines include compounds in which an alkyl substituent group is bonded to dihydropyridine in position 1.

Preferred base-generating substances are compounds selected from a set consisting of benzyl carbamate in which [i] a nitro group is present at position 2 of the benzyl group, or nitro groups are present at positions 2 and 6 of said benzyl group, [ii] methoxy groups may be present at positions 4 and 5 of the benzyl group, [iii] $R^8$ indicates H, an alkyl group with 1 to 10 carbon atoms, an aralkyl group or an aryl group, and [iv] $R^4$ indicates an alkyl group with 1 to 10 carbon atoms, an aralkyl group or an aryl group; benzoin carbamate in which [i] Ar is a phenyl group, [ii] $R^5$ indicates a hydrogen atom, and [iii] $R^6$ indicates an alkyl group with 5 to 10 carbon atoms; o-carbamoylhydroxyamines in which [i] $R^7$ and $R^8$ are bonded to each other to form a phthaloyl group, [ii] $R^9$ is a hydrogen atom, and [iii] $R^{10}$ is an alkyl group with 5 to 10 carbon atoms; and N-substituted 4-(o-nitrophenyl)dihydropyridines in which a methyl group or ethyl group is bonded to the dihydropyridine in position 1, and methoxycarbonyl groups are bonded in positions 3 and 5. Such compounds may be included in the composition at the rate of 0.1 to 20 wt %.

More preferred base-generating substances are compounds selected from a set consisting of 4-(o-nitrophenyl) dihydropyridines in which a substituent group selected from a set consisting of alkyl groups, alkenyl groups, aryl groups and aralkyl groups is bonded to the dihydropyridine in position 1, hydrocarbon groups with 1 to 3 carbon atoms are bonded in positions 2 and 6, and alkoxycarbonyl groups selected from a set consisting of alkoxy groups with 1 to 4 carbon atoms are bonded in positions 3 and 5. Such compounds may be included in the composition at the rate of 0.05 to 10 wt % and are preferably included in the composition at the rate of 0.1 to 5 wt %.

Especially desirable among these compounds are N-substituted 4-(o-nitrophenyl) dihydropyridines in which a methyl group, ethyl group or benzyl group is bonded to the dihydropyridine in position 1, methyl groups or ethyl groups are bonded in positions 2 and 6, and alkoxycarbonyl groups selected from a set of alkoxy groups with 1 to 4 carbon atoms are bonded in positions 3 and 5. Even more desirable among N-substituted 4-(o-nitrophenyl) dihydropyridines are N-substituted nifedipine compounds in which a methyl groups, ethyl group or benzyl group is bonded to the dihydropyridine in position 1, methyl groups are bonded in positions 2 and 6, and dimethoxycarbonyl groups are bonded in positions 3 and 5.

Compared to o-nitrobenzyl carbamate compounds, which are conventionally well known as photolyzable base-generating substances, N-substituted nifedipine compounds and derivatives of the same undergo photolysis at longer radiation wavelengths. Additionally, the photolysis rate is extremely rapid, and the base generated is a quaternary ammonium hydroxide, which as a higher catalytic activity than the amine compounds produced by carbamate compounds.

The siloxane polymer which has silicon-hydrogen bonds (Si—H) can be expressed by the following general formula

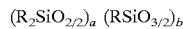

wherein each R is independently selected from the group consisting essentially of hydrogen atoms and hydrocarbon groups with 1 to 8 carbon atoms. However, the sum of the moieties in which the R in $RSiO_{3/2}$ is a hydrogen atom and the moieties in which one or both of the R's in $R_2SiO_{2/2}$ is a hydrogen atom is at least 5% of $RSiO_{3/2}$ unit and $R_2SiO_{2/2}$ unit. At least one of the divalent oxygen atoms bonded to the silicon atom in each of $R_2SiO_{2/2}$ and $RSiO_{3/2}$ is bonded to another silicon atom to form a siloxane bond; the remaining oxygen atoms may be bonded to other silicon atoms to form siloxane bonds, bonded to methyl groups or ethyl groups to form alkoxy groups, or bonded to hydrogen atoms to form silanol groups. In the siloxane polymer $0 \leq a \leq 1$, $0 \leq b \leq 1$, and $a+b=1$.

Examples of $R_2SiO_{2/2}$ include $Me_2SiO_{2/2}$, $MeHSiO_{2/2}$, $MePhSiO_{2/2}$, $MeViSiO_{2/2}$, $Me(F_3Pr)SiO_{2/2}$, $MeEtSiO_{2/2}$, $Ph_2SiO_{2/2}$, $PhHSiO_{2/2}$, and $PhViSiO_{2/2}$.

Examples of R in $RSiO_{3/2}$ include hydrogen, methyl, ethyl, propyl, butyl, hexyl, cyclohexyl, octyl, trifluoropropyl, trimethylsilylmethyl, phenyl, para-tolyl, meta-tolyl, phenethyl and 4-vinylphenyl, and others.

Siloxane polymers which have $HSiO_{3/2}$ include D-T resins $\{(R_2SiO_{2/2})(HSiO_{3/2})\}$. These resins are known in the art and may be manufactured by cohydrolysis of mixtures of chlorosilanes such as dimethyldichlorosilane, methyltrichlorosilane and trichlorosilane; or dimethyldichlorosilane, phenyltrichlorosilane and trichlorosilane; or dimethyldichlorosilane and trichlorosilane; or diphenyldichlorosilane, methyltrichlorosilane and trichlorosilane; or diphenyldichlorosilane, phenyltrichlorosilane and trichlorosilane; or diphenyldichlorosilane and trichlorosilane.

The resins may also be manufactured by hydrolysis and a condensation reaction using diphenylsilanediol, methyltrichlorosilane and trichlorosilane; or diphenylsilanediol, phenyltrichlorosilane and trichlorosilane; or diphenylsilanediol and trichlorosilane.

Additionally the resins may be manufactured by a condensation reaction using diphenyldisilanediol, methyltrimethoxysilane and trimethoxysilane.

Polyhydrodienesilsesquioxane type resins ($HSiO_{3/2}$) may be manufactured by cohydrolysis using phenyltrichlorosilane and trichlorosilane; or methyltrichlorosilane and trichlorosilane; or cyclohexyltrichlorosilane and trichlorosilane; or n-hexyltrichlorosilane and trichlorosilane; or 4-vinylphenyl-trichlorosilane and trichlorosilane; or by hydrolysis using trichlorosilane; or trimethoxysilane; or triethoxysilane.

Examples of siloxane polymers containing $HRSiO_{2/2}$ include siloxane polymers whose main constituent components are straight-chain structures such as diphenylsiloxane-methyl-hydrodienesiloxane copolymers whose principal chains consist of methylhydrodienesiloxane ($CH_3(H)SiO$) and diphenylsiloxane ($Ph_2SiO$)); and ($HRSiO_{2/2}$)($RSiO_{3/2}$) "D-T" resins.

The D-T resins may be manufactured by cohydrolysis using cyclic siloxane compounds such as a cyclic oligomer of methylhydrodienesiloxane or a cyclic oligomer of phenylhydrodienesiloxane, methyltrichlorosilane and dichlorosilane; or phenyltrichlorosilane and dichlorosilane; or methyltrichlorosilane and methyldichlorosilane; or phenyltrichlorosilane and methyldichlorosilane; or methyltrichlorosilane and phenyldichlorosilane; or phenyltrichlorosilane and phenyldichlorosilane.

If a small amount of a silane compound which is capable of providing a M component ($R_3SiO_{1/2}$) by hydrolysis, such as trimethylchlorosilane, vinyldimethylchlorosilane, dimethylchlorosilane or 4-(vinylphenyl)dimethylchlorosilane, is used in the resin synthesis reaction, the molecular weight of the resin can be adjusted, and reactive functional groups such as vinyl groups or 4-vinylphenyl groups can be introduced. If a silane compound which is capable of providing a Q component ($SiO_{4/2}$) by hydrolysis, such as silicon tetrachloride or methyl ortho-silicate is used, the molecular weight and hardness of the resin can be adjusted.

The acid substance (c) is preferably selected from the group consisting essentially of carboxylic acid, phenols, acid anhydrides and phosphoric acids. The acid has the function of neutralizing small amounts of basic substances that may be present in the composition, or small amounts of basic substances produced from component (a) by photolysis due to stray light or pyrolysis caused by heat. The acid has the effect of improving the storage stability of the composition of the present embodiment, as well as the effect of improving the contrast of patterns formed by photo-patterning. It is desirable that the acid (c) be included in the composition in an amount that is 90 mol % or less relative to the base-generating substance of component (a).

Instead of adding the acid substances directly, it is possible to add a siloxane polymer containing silicon-bonded acetoxy groups and to use the acetic acid generated in-situ by the reaction of these functional groups with water in the atmosphere as the acid substance.

Examples of carboxylic acids which can be used include saturated, unsaturated and hetero-atom-substituted carboxylic acids such as formic acid, oxalic acid, acetic acid, propionic acid, hexanoic acid, cyclohexanoic acid, octanoic acid, adipic acid, benzoic acid, terephthalic acid, phthalic acid, trimellitic acid, pyromellitic acid, chloroacetic acid, trichloroacetic acid and chlorobenzoic acid, and others. Examples of phenols which can be used include phenol, cresol, naphthol, nitrophenol and chlorophenol, and others. Examples of acid anhydrides which can be use include acetic anhydride, propionic anhydride, benzoic anhydride, phthalic anhydride, pyromellitic anhydride and trimellitic anhydride, and others. Examples of phosphoric acids which can be used include ortho-phosphoric acid, phosphorous acid, pyrophosphoric acid, meta-phosphoric acid and monoesters of these acids.

The curable composition of the instant invention may optionally comprise (d) a cross-linking agent which has hydroxy groups. The cross-linking agent used here is a compound which is capable of forming links between the siloxane polymer by reacting with the silicon-hydrogen bonds (Si—H) to form siloxane bonds (Si—O—Si) or Si—O—C bonds. It is desirable that this cross-linking agent be selected from the group consisting essentially of silane compounds which have an average of at least two silanol groups (SiOH) per molecule, silicone polymers which have an average of at least two silanol groups (SiOH) per polymer molecule, and water.

Examples of silane compounds which have at least two silanol groups per molecule include di(aryl)silanediols such as diphenylsilanediol di(meta-tolyl)silanediol and di(para-toyl)silanediol and others; and di(alkyl)silanediols with high-bulk alkyl groups, such as di(cyclohexyl)silanediol. Examples of silicone polymers which have an average of at least two silanol groups (SiOH) per polymer molecule include silanol-functional polysilsesquioxanes, dimethylsiloxane oligomer and polymers in which both ends are stopped by silanol groups, diphenylsiloxane oligomer in which both ends are stopped by silanol groups, terminal silanol-stopped polyphenylsilsesquioxanes and terminal silanol-stopped polymethylsilsesquioxanes, as well as D-T resins which have silanol groups, MQ resins in which some or all of the $S_3SiO_{1/2}$ units consist of substituent groups with silanol groups which can be expressed by the formula $(HO)R_2SiO_{1/2}$, diphenylsiloxane-methylsilsesquioxane copolymer resins which have silanol groups, dimethylsiloxane-phenylsilsesquioxane copolymer resins which have silanol groups, and diphenylsiloxane-phenylsilsesquioxane copolymer resin which have silanol groups.

In cases where the siloxane polymer (b) has an average of at least two silanol groups (SiOH) per polymer molecule, this polymer itself may act as such as silicone polymer molecule which as an average of at least two silanol groups (SiOH) per molecule.

The curable composition is irradiated with radiation at a temperature of 0° C. to 100° C. in an atmosphere having a relative humidity of 10% or greater, with a light-blocking pattern (mask) placed between a coating of the curable composition and the radiation source. When hydroxy groups (OH) are already contained in the curable composition, water (water vapor) need not be present in the atmosphere.

Following irradiation, if necessary, the irradiated coating is treated for 1 hour or less at 0° C. to 200° C. causing a reaction to proceed in which silicon-oxygen bonds (Si—O) and hydrogen molecules ($H_2$) are formed from [i] the hydroxy groups (OH) in the curable composition or water molecules which have entered said curable composition from the atmosphere, and [ii] silicon-hydrogen bonds (Si—H), as a result of the catalytic effect of a basic compound produced in the areas irradiated with radiation. This curable composition coating is then contacted with an inorganic or organic solvent so that the uncured portions of the curable composition are dissolved and removed (developing process), forming a negative pattern consisting of the cured coating. Further heating is then performed so that the curing reaction of the siloxane polymer is accelerated, forming a cured silicone pattern corresponding to the negative of the photo-mask.

In the present invention, the term "radiation" refers to light (including radiation), electron beams, X-rays or ion beams, and others. In cases where radiation is used, it is desirable to use radiation containing an ultraviolet. Although there are no particular restrictions on the quantity of irradiation with radiation that is applied, it is desirable that the irradiation time be sufficient to decompose a considerable portion, i.e., 5 to 100%, of the base-generating substance, converting said substance into a basic compound catalyst. Furthermore, it is necessary that the amount of irradiation be sufficient to produce a base that is equal to or greater than (in terms of chemical equivalence) the acid substance contained in the curable composition.

The conditions of heat-curing following the formation of the negative pattern depend on the properties of the individual siloxane polymers and the heat-curing is not always requisite; however, in the case of organic resins such as silicone resins having organic group, heat curing in the range of 50° C. to 400° C. may be appropriate, while in the case of inorganic polymers such as polyhydrodienesilsesquioxanes, heat-curing at 200° C. to 1400° C. may be appropriate.

A solution of the curable composition is applied to the surface of a substrate by a method such as spin coating, casting or painting, and others and some or all of the solvent is removed. A photo-mask which partially blocks the radiation is placed between the coating of the composition and the radiation source, and the coating is irradiated. Either immediately or following the after-treatment the substrate is washed with an inorganic or organic solvent so that the uncured portions of the coating are removed, producing a pattern consisting of the cured coating. After the solvent is dried, a heat treatment is again performed so that the pattern consisting of the cured coating is further cured.

There are no particular restrictions on the solvent used for the coating application of the curable composition, as long as said solvent will dissolve the curable composition without reacting with said composition, and has an appropriate degree of volatility so that said solvent can be removed at ordinary temperatures or by being heated to a temperature of 200° C. or less. Solvents useful herein include saturated hydrocarbons such as hexane, heptane, octane, decane, dodecane, cyclohexane, cycloheptane, cyclooctane and decahydronaphthalane, and others; aromatic hydrocarbons such as toluene, xylene, mesitylene, ethylbenzene, t-butylbenzene and tetrahydronaphthalene, and others; halogenated hydrocarbons such as methylene chloride, chlorobenzene and dichlorobenzene, and others; ethers such as tetrahydrofuran, propyl ether, butyl ether, pentyl ether, phenyl ether, anisole and t-butylphenyl ether, and others; ketones such as acetone, methyl ethyl ketone, diethyl ketone, methyl propyl ketone, methyl butyl ketone, methyl isobutyl ketone, methyl (t-butyl) ketone, methyl pentyl ketone and diisopropyl ketone, and others; esters such as ethyl acetate, propyl acetate, butyl acetate, t-butyl acetate, methyl propionate, ethyl propionate, isopropyl propionate, t-butyl propionate, methyl butyrate, ethyl butyrate, propyl butyrate and t-butyl butyrate, etc., and alcohols such as ethanol, propanol, isopropyl alcohol, n-butanol, t-butyl alcohol, n-hexanol, cyclohexanol, methoxyethanol and t-butoxyethanol, and others.

Pre-heating performed prior to the irradiation with radiation is an effective means of removing the residual solvent and obtaining a more densely textured coating film. The need for pre-heating varies according to the volatility of the solvent, solubility of the substrate and thickness of the coating film. If the base generating substance is pyrolyzed by this pre-baking, the photo-patternability of the coating will be lost therefore long-term pre-baking at a temperature near the thermal decomposition temperature of the base-generating substance or at even higher temperatures must be avoided. Therefore, pre-baking at a temperature of 100° C. or lower is generally appropriate.

After-heating performed following the irradiation accelerates the catalytic reaction induced by the basic, chemically amplifying the effect of the radiation. However in the case of heating performed at a temperature or for a time greater than that which is necessary, there is a danger that a non-catalytic reaction will be promoted in the areas that were not irradiated. In some cases, a reaction may occur in the non-irradiated portions as a result of the generation of a base due to the thermal decomposition of the base-generating substance, or as a result of diffusion of said base-generating substance. Therefore, after-heating at a temperature of 200° C. or lower is generally appropriate.

To form a cured silicone pattern, the radiation-irradiated portions of the curable composition and the non-irradiated portions of the curable composition must show a sufficient difference in solubility in the solvent used to remove the uncured portions. In addition, it is important that the solvent used be a solvent which tends not to cause swelling of the radiation-irradiated portions. Examples of solvents which can be used for this purpose include alkaline solvents such as an aqueous solution of tetramethylammonium hydroxide or an aqueous solution of sodium carbonate, in addition to the solvents used in the curable composition solution, described above.

The molecular weights, molecular weight distributions and softening points of siloxane polymers which can be used in the present invention, the types of Si—H functional groups, the types and amounts added of base-generating, the radiation irradiation time, the intensity of the radiation, the temperature during irradiation, the humidity during irradiation and the reaction conditions of the after-reaction performed following irradiation (reaction temperature, humidity during the after-reaction and after-reaction time) are interrelated. Accordingly, appropriate conditions cannot be specified as fixed values. However, the pre-heating temperature, the temperature during irradiation with radiation and the temperature during after-heating must be lower than the thermal decomposition temperature of the base-generating substance.

Sensitizing agents may be optionally added to the curable composition. Examples of sensitizing agents which can be used include N-phenylglycine, N-phenyldiethanolamine, azidoanthraquinone and 3,3'-carbonyl (diethylaminocumarin), and others.

Additional components may also be added to the curable composition of the present invention as long as said additional components do not interfere with the basic constitution of the present invention. In particular, the thermal curing reaction of the remaining negative portions following pattern formation by development can be further promoted by adding a component which acts as a catalyst in the cross-linking reaction of the siloxane polymer under conditions of high-temperature heating. Examples of such components include radical initiators such as peroxides or azo compounds; titanium compounds and tin compounds which promote a condensation reaction involving silanol groups at high temperatures; and transition metal catalysts which show catalytic activity in a hydrosilylation reaction at high temperatures. Other organic or inorganic components which have specified functions or physical properties may also be dissolved or dispersed in the curable composition of the present invention, forming a cured coating or cured coating pattern which has desired functions or physical properties.

The composition of the present invention has a highly sensitivity radiation curability. The cured product is based on a curing mechanism which utilizes photochemical amplification. Specifically, a base generated from a base-generating substance by a single photon acts catalytically in the curing reaction of the present composition, so that numerous cross-links can be formed by means of a minute quantity of radiation. Furthermore, the cross-linking reaction using the base generated as a catalyst can be freely controlled by controlling the after-treatment conditions (after-reaction temperature and after-reaction time) so that a high sensitivity can be realized by performing said after-treatment at a high temperature or for a long period of time.

Additionally, the reactivity of the functional groups of the siloxane polymer (b) contribute to curing. Specifically, it is known that hydrogen atoms bonded directly to silicon atoms react with hydroxy groups in the present of a basic catalyst to form hydrogen molecules and silicon-oxygen bonds. However, this reactivity is especially high in the case of compounds in which two or three oxygen atoms are bonded to the silicon atoms (among the hydrogen atoms bonded to said silicon atoms). Accordingly, the curing of the present composition proceeds rapidly.

Finally, there is a high level of catalytic activity of the catalyst component produced by the photo-reaction. Specially, the basic substances generated by the base-generating substances are primary or secondary amines or quaternary ammonium hydroxides, and these substances are highly basic substances. Among these substances, quaternary ammonium hydroxides in particular show an especially strong basicity. Such compounds have a high activity as catalysts for the reaction between hydroxy groups and hydrogen atoms bonded directly to silicon atoms, and contribute to the rapid curing of the present composition.

The composition of the present invention shows little weight reduction accompanying curing, and also shows little curing shrinkage. The curing of the composition of the present invention depends on the formation of hydrogen and silicon-oxygen bonds by the reaction of hydroxy groups with hydrogen atoms bonded directly to silicon atoms, and the weight reduction (or increase) characteristics in this reaction are such that there is little weight reduction accompanying curing. Specifically, the curing of the composition of the present invention depends on the formation of hydrogen molecules and silicon-oxygen bonds by the reaction of silanol groups with hydrogen atoms bonded directly to silicon atoms, or on the formation of hydrogen molecules and silicon-oxygen bonds by the reaction of water in the composition or in the atmosphere with hydrogen atoms bonded directly to silicon atoms. In the former case, there is a weight reduction of one hydrogen molecule for each cross-link formed. In the latter case, there is a weight increase of one oxygen atom and a weight reduction of two hydrogen molecules for each cross-link formed. Accordingly, the weight reduction involved is extremely small compared to that seen in widely used silicon polymer cross-linking reactions such as dehydration condensation, de-alcohol condensation, de-acetic acid condensation or de-oxime condensation. In some cases a slight weight increase is actually seen. The composition of the present invention shows little weight reduction accompanying curing, and also shows little curing shrinkage. Accordingly, problems such as cracking, peeling from the surface and warping of the coating substance which are commonly caused by curing shrinkage can be minimized.

The curable composition shows an improved solution stability compared to compositions which do not contain such an acid substance, and is further characterized by the fact that the permissible range of amounts of irradiation that produce the same resolution is greatly expanded in photo-patterning as well. By using this technique, it is possible to use ultraviolet light as a means of forming images in the composition of the present invention applied as a coating to the surface of a substrate, and to perform a process in which the fine pattern of a mask is formed under ordinary white light. Furthermore, the range of optimal ultraviolet irradiation during image formation is greatly expanded, so that the tolerance of the process can be expanded. Patterns formed in this manner make it possible to form, by means of an after-curing reaction, cured silicone films which are superior in terms of insulating properties, heat resistance and resistance to oxygen plasma.

So that those skilled in the art can understand and appreciate the invention taught herein, the following examples are presented, it being understood that these examples should not be used to limit the scope of this invention found in the claims.

In the examples below, "$^{29}Si\{1H\}$-NMR" refers to the silicon 29 nuclear magnetic resonance spectrum (proton decoupling). $CDCl_3$ indicates heavy chloroform. The information shown in parentheses in the nuclear magnetic resonance spectral data indicates the functional groups giving rise to said spectral data. The chemical shifts shown for the silicon 29-NMR spectra are values calculated with the chemical shift of the silicon in the tetramethylsilane ($CDCl_3$ solution) used as an external standard taken as zero.

Ultraviolet irradiation experiments were performed using a UIS-500C Lamphouse 500-watt mercury-xenon lamp manufactured by Ushio Denki K.K., and 200-watt mercury-xenon lamp manufactured by Yamashita Denso K.K.

"GPC" refers to gel permeation chromatography.

PREPARATION EXAMPLE 1
Synthesis of Base-Generating Substance 12 g of nifedipine was dissolved in 50 ml of tetrahydrofuran under a nitrogen atmosphere. 1.66 g of a sodium hydride/oil dispersion (60% NaH) was added. Following agitation for some time, 10 ml of methyl iodide was added, and the resulting mixture was agitated for 1 hour at 88° C. 200 ml of ethyl acetate was then added. The resulting organic layer was washed several times with water, and was then dehydrated with sodium sulfate. The sodium sulfate was filtered out, and the solvent was removed from the filtrate by means of a rotary evaporator. The solid obtained was dissolved in 200 ml of MIBK, and hexane was added to this, producing 8.9 g of N-methylnifedipine in the form of yellow crystals. This compound had a melting point of 184 to 187° C., infrared absorption spectrum of 1690 $cm^{-1}$: C=O, 1524 $cm^{-1}$: N—O, and proton-NMR spectrum (solvent: $CDCl_3$): 2.5 (6H, methyl), 3.3 (3H, N-methyl), 3.6 (6H, O-methyl), 5.7 (1H, C—H), 7.2–7.6 (4H, C—H in aromatic nucleus).

PREPARATION EXAMPLE 2
Synthesis of Base-Generating Substance 100 ml of toluene, 10 g of 2-nitrobenzyl alcohol and 11.4 ml of octyl isocyanate heated to reflux for 2 hours in a nitrogen atmosphere. After being cooled, the reaction solution was washed several times with water, and the toluene solution obtained was dehydrated with sodium sulfate. The sodium sulfate was filtered out, and the solvent was removed. The solid obtained was recrystallized twice from hexane, producing 12.5 g of o-nitrobenzene-n-octylcarbamate in the form of pale yellow needle crystals. Melting point: 70 to 71° C., infrared absorption spectrum: 3331 $cm^{-1}$, 1691 $cm^{-1}$.

PREPARATION EXAMPLE 3
Polyhydrodienesilsesquioxane

The polyhydrodienesilsesquioxane used in the examples described below was obtained from Dow Corning Corporation (Midland, Mich., U.S.A.). Molecular weight: 16000, Mw/Mn=approximately 2.5, infrared absorption spectrum: 2264 $cm^{-1}$ (Si—H); no absorption attributable to Si—OH was observed.

PREPARATION EXAMPLE 4
Synthesis of Phenylsilsesquioxane-Hydrodienesilsesquioxane Resin 170 ml of dioxane, 15.4 g of phenyltrichlorosilane and 9.75 g of trichlorosilane were placed in a flask filled with nitrogen. This mixture was cooled in a water bath. A solution prepared by dissolving 8.2 g of water in 60 ml of dioxane was added over a period of 30 minutes. Following agitation for 30 minutes at room temperature, the solvent was removed. The residue was dissolved in 100 ml of toluene, and the resulting organic layer was washed several times with water. After the organic layer was dehydrated with sodium sulfate, the solvent and volatile components were distilled away in vacuo at 60° C., producing a white solid. Molecular weight: 630, infrared absorption spectrum: 2253 $cm^{-1}$ (Si—H), 3358 $cm^{-1}$ (SiOH), 1163 to 1061 $cm^{-1}$ (Si—O—Si).

The silicon-hydrogen bonds in the resin obtained accounted for approximately 50% of the total silicon.

PREPARATION EXAMPLE 5
Synthesis of Phenylsilsesquioxane-Hydrodienesilsesquioxane Resin 25 g of dioxane, 22.1 g of phenyltrichlorosilane and 2.5 g of trichlorosilane were placed in a flask filled with nitrogen. This mixture was cooled in a water bath. A solution prepared by dissolving 6 g of water in 20 ml of dioxane was added over a period of 30 minutes. Following agitation for 30 minutes at room temperature, the solvent was removed by means of a rotary evaporator. The residue was dissolved in 150 ml of toluene, and the resulting organic layer was washed several times with water. After the organic layer was dehydrated with sodium sulfate, the solvent and volatile components were distilled away in vacuo, producing a white solid. Molecular weight (Mw, calculated as polystyrene): 4400, infrared absorption spectrum: 2238 $cm^{-1}$ (Si—H), 3358 $cm^{-1}$ (SiOH), 1126 $cm^{-1}$ (Si—Ph).

The silicon-hydrogen bonds in the resin obtained accounted for approximately 50% of the total silicon.

Improvement of Storage Stability

EXAMPLE 1
Storage Stability of Hydrodienesilsesquioxane Resin with Acid Substance Added 1 part of a hydrodienesilsesquioxane resin (Preparation Example 3) was dissolved in 3 parts of MIBK, and N-methylnifedipine (Preparation Example 1) was added to this solution at the rate of 1 wt % relative to the hydrodienesilsesquioxane resin. Solutions were prepared by adding benzoic acid, trifluoroacetic acid or pyromellitic anhydride to the solution at the rate of 1, 5 or 10 wt % relative to the N-methylnifedipine. 1 g of each solution prepared was placed in a polypropylene vessel, and was allowed to stand at room temperature under a white fluorescent light. The time required for each solution to gel was measured. The results obtained are shown in Table 1.

COMPARATIVE EXAMPLE 1
Storage Stability of Hydrodienesilsesquioxane Resin with No Acid Substance Added 1 part of a hydrodienesilsesquioxane resin (Preparation Example 3) was dissolved in 3 parts of MIBK, and N-methylnifedipine (Preparation Example 1) was added to this solution at the rate of 1 wt % relative to the hydrodienesilsesquioxane resin. 1 g of this solution was placed in a polypropylene vessel, and was allowed to stand at room temperature under a white fluorescent light. The time required for the solution to gel was measured. The results obtained are shown in Table 1.

EXAMPLE 2
Gelation Time of Phenylsilsesquioxane-Hydrodienesilsesquioxane Solution with Acid Substance Added 1 part of phenylsilsesquioxane-hydrodienesilsesquioxane (Preparation Example 4) was dissolved in 3 parts of methyl isobutyl ketone (MIBK), and N-methylnifedipine was added to this solution at the rate of 5 wt % relative to the resin. Benzoic acid was added at the rate of 1, 5 or 10 wt % relative to the resin. Using the resulting solutions, an evaluation was performed as in Example 1. The results obtained are shown in Table 2.

COMPARATIVE EXAMPLE 2
Gelation Time of Phenylsilsesquioxane-Hydrodienesilsesquioxane Solution with Acid Substance Added An evaluation was performed as in Comparative Example 1, except that phenylsilsesquioxane-hydrodienesilsesquioxane (Preparation Example 4) was used instead of hydrodienesilsesquioxane. The results obtained are shown in Table 2.

It is clear from the Examples 1 and 2 and Comparative Examples 1 and 2 that the composition of the present invention is superior in terms of storage stability.

Evaluation of Resolution

EXAMPLE 3

Resolution of Hydrodienesilsesquioxane Resin

Samples were prepared by applying the solutions prepared in Example 1 to the surfaces of silicon wafers by spin coating (3 seconds at 500 rpm and 10 seconds at 1500 rpm). These samples were pre-baked for 1 minute at 80° C. Samples were irradiated with prescribed amounts of ultraviolet light (3.75, 7.5, 15 or 22.5 mJ/cm$^2$, measured at 254 nm), and the coatings produced were post-baked for 1 minute at 150° C. in air. These silicon wafers were then developed with MIBK. The results obtained are shown in Tables 3 through 5.

COMPARATIVE EXAMPLE 3

An evaluation was performed by the same method as in Example 3 using the sample prepared in Comparative Example 1. The results obtained are shown in Tables 3 through 5.

EXAMPLE 4

Resolution of Hydrodienesilsesquioxane Resin with 2-Nitrobenzyl n-Octylcarbamate Added 1 part of a hydrodienesilsesquioxane resin (Preparation Example 3) was dissolved in 3 parts of MIBK. 2-nitrobenzyl n-octylcarbamate (Preparation Example 2) was added to this solution at the rate of 5 wt % relative to the hydrodienesilsesquioxane resin. Solutions were prepared by adding trifluoroacetic acid to the solution at the rate of either 5 or 10 wt % relative to the n-nitrobenzyl n-octylcarbamate. Samples were prepared by applying these solutions to the surfaces of silicon wafers by spin coating (3 seconds at 500 rpm and 10 seconds at 1500 rpm). These samples were pre-baked for 1 minute at 80° C. The samples were irradiated with prescribed amounts of ultraviolet light (7.5, 11.25 or 15 mJ/cm$^2$, measured at 254 nm), and these samples were then developed with MIBK. The results obtained are shown in Table 6.

COMPARATIVE EXAMPLE 4

1 part of a hydrodienesilsesquioxane resin (Preparation Example 3) was dissolved in 3 parts of MIBK, and 2-nitrobenzyl n-octylcarbamate (Preparation Example 2) was added to this solution at the rate of 5 wt % relative to the hydrodienesilsesquioxane resin. This solution was evaluated by the same method as in Example 4. The results obtained are shown in Table 6.

EXAMPLE 5

Resolution of Phenylsilsesquioxane-Hydrodienesilsesquioxane 1 part of phenylsilsesquioxane-hydrodienesilsesquioxane (Preparation Example 4) was dissolved in 3 parts of methyl isobutyl ketone (MIBK), and N-methylnifedipine was added to this solution at the rate of 1 wt % relative to the resin. Benzoic acid was added at the rate of 1 or 5 wt % relative to the base-generating substance. Using the resulting solutions, an evaluation was performed as in Example 4. The results obtained are shown in Table 7.

COMPARATIVE EXAMPLE 5

1 part of phenylsilsesquioxane-hydrodienesilsesquioxane (Preparation Example 4) was dissolved in 3 parts of methyl isobutyl ketone (MIBK), and N-methylnifedipine was added to this solution at the rate of 1 wt % relative to the resin. Using this solution, an evaluation was performed as in Example 4. The results obtained are shown in Table 7.

EXAMPLE 6

Resolution of Phenylsilsesquioxane-Hydrodienesilsesquioxane 1 part of phenylsilsesquioxane-hydrodienesilsesquioxane (Preparation Example 5) was dissolved in 3 parts of methyl isobutyl ketone (MIBK), and N-methylnifedipine was added to this solution at the rate of 2 wt % relative to the resin. Benzoic acid was added at the rate of 1 or 5 wt % relative to the base-generating substance. Using the resulting solutions, an evaluation was performed as in Example 4. The results obtained are shown in Table 8.

COMPARATIVE EXAMPLE 6

1 part of phenylsilsesquioxane-hydrodienesilsesquioxane (Preparation Example 5) was dissolved in 3 parts of methyl isobutyl ketone (MIBK), and N-methylnifedipine was added to this solution at the rate of 2 wt % relative to the resin. Using this solution, an evaluation was performed as in Example 4. The results obtained are shown in Table 8.

As is clear from the above Examples 3 through 6, the composition of the present invention shows a good resolution at a low irradiation of 3.75 mJ/cm$^2$.

TABLE 1

Gelation time of hydrodienesilsesquioxane solutions

| Acid substance* | Benzoic acid | Trifluoro-acetic acid | Trifluoro-pyromellitic acid anhydride | Not added |
|---|---|---|---|---|
| 0 wt. % | | | | 2 hours |
| 1 wt. % | 6 hours | 9 hours | 10 hours | |
| 5 wt. % | 6 hours | 8 hours | 10 hours | |
| 10 wt. % | 6 hours | 8 hours | 8 hours | |

*wt % of acid substance relative to N-methylnifedipine

TABLE 2

Gelation time of phenylsilsesquioxane-hydrodienesilsesquioxane solution

| Acid substance* | Benzoic acid | Not added |
|---|---|---|
| 0 wt. % | | 8 hours |
| 1 wt. % | 13 hours | |
| 5 wt. % | 13 hours | |
| 10 wt. % | 13 hours | |

*wt % of acid substance relative to N-methylnifedipine.

TABLE 3

Resolution vs. amount of irradiation in hydrodienesilsesquioxane (Benzoic Acid Added)
Resolution According to Amount of Acid Added

| Amount of Irradiation (mJ/cm$^2$) | 1 wt. % (μm) | 5 wt. % (μm) | 10 wt. % (μm) | 0 wt. % (μm) |
|---|---|---|---|---|
| 3.75 | 3.5 | 5.0 | 5.0 | 5.6 |
| 7.5 | 3.9 (1.1)** | 5.6 (1.1) | 5.0 (1.0) | 7.0 (1.3) |
| 22.5 | 6.2 (1.8) | 6.2 (1.3) | 5.0 (1.0) | 13 (2.3) |

**Ratio of resolution relative to value obtained at 3.75 mJ/cm$^2$

TABLE 4

Trifluoroacetic Acid Added
Resolution According to Amount of Acid Added

| Amount of Irradiation (mJ/cm$^2$) | 1 wt. % (μm) | 5 wt. % (μm) | 10 wt. % (μm) | 0 wt. % (μm) |
|---|---|---|---|---|
| 3.75 | 5.6 | 3.9 | 4.4 | 5.6 |
| 7.5 | 5.6 (1.0)** | 4.4 (1.1) | 4.4 (1.0) | 7.0 (1.3) |
| 15 | 5.6 (1.0) | 5.0 (1.3) | 5.0 (1.0) | 11 (2.0) |

**Ratio of resolution relative to value obtained at 3.75 mJ/cm$^2$

TABLE 5

Pyromellitic Anhydride Added
Resolution According to Amount of Acid Added

| Amount of Irradiation (mJ/cm$^2$) | 1 wt. % (μm) | 5 wt. % (μm) | 0 wt. % (μm) |
|---|---|---|---|
| 3.75 | 4.4 | 5.0 | 5.6 |
| 7.5 | 4.4 (1.0)** | 5.0 (1.0) | 7.0 (1.3) |
| 15 | 5.6 (1.3) | 5.6 (1.3) | 11 (2.0) |

**Ratio of resolution relative to value obtained at 3.75 mJ/cm$^2$

TABLE 6

Trifluoroacetic Acid Added
Resolution According to Amount of Acid Added

| Amount of Irradiation* (mJ/cm$^2$) | 1 wt. % (μm) | 5 wt. % (μm) | 0 wt. % (μm) |
|---|---|---|---|
| 7.5 | 3.9 | 5.0 | 6.3 |
| 11.25 | 6.8 (1.6)** | 5.0 (1.0) | 8.8 (1.4) |
| 15 | 13 (3.2) | 5.0 (1.0) | 14 (2.2) |

**Ratio of resolution relative to value obtained at 7.5 mJ/cm$^2$

TABLE 7

Resolution vs. amount of irradiation in phenylsilsesquioxane-hydrodienesilsesquioxane
Resolution According to Amount of Acid Added

| Amount of Irradiation* (mJ/cm$^2$) | 1 wt. % (μm) | 5 wt. % (μm) | 0 wt. % (μm) |
|---|---|---|---|
| 3.75 | 3.1 | 3.1 | 3.1 |
| 7.5 | 3.1 (1.0)** | 3.1 (1.0) | 4.4 (1.4) |
| 15 | 7.0 (2.3) | 3.1 (1.0) | 7.0 (2.3) |

**Ratio of resolution relative to value obtained at 3.75 mJ/cm$^2$

TABLE 8

Resolution vs. amount of irradiation in phenylsilsesquioxane-hydrodienesilsesquioxane
Resolution According to Amount of Acid Added

| Amount of Irradiation* (mJ/cm$^2$) | 1 wt. % (μm) | 5 wt. % (μm) | 0 wt. % (μm) |
|---|---|---|---|
| 3.75 | 3.1 | 3.1 | 3.5 |
| 7.5 | 3.5 (1.1)** | 3.1 (1.0) | 4.4 (1.4) |
| 15 | 7.9 (2.5) | 3.1 (1.0) | 9.9 (2.8) |

**Ratio of resolution relative to value obtained at 3.75 mJ/cm$^2$

What we claim is:

1. A curable composition comprising:
    (a) 0.01 to 20 wt % based on the total weight of the composition of a base-generating substance selected from the group consisting of benzyl carbamate compounds, benzoin carbamate compounds, o-carbamoylhydroxyamines, o-carbamoyloximes, aromatic sulfonamides, alpha-lactams, N-(2-aryylethenyl) amides, aryl azide compounds, N-arylformamides and N-substituted 4-(o-nitrophenyl)dihydropyridines;
    (b) a siloxane polymer having the general formula

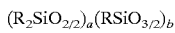
    $(R_2SiO_{2/2})_a(RSiO_{3/2})_b$ wherein each R is independently selected from the group consisting of hydrogen atoms and hydrocarbon groups with 1 to 8 carbon atoms with the provision that the sum of the moieties in which the R in $RSiO_{3/2}$ is a hydrogen atom and the moieties in which one or both of the R's in $R_2SiO_{2/2}$ is a hydrogen atom is at least 5% of the amount of $RSiO_{3/2}$ units and $R_2SiO_{2/2}$ unit; and $0 \leq a \leq 1$, $0 \leq b \leq 1$, and $a+b=1$; and
    (c) an acid substance selected from the group consisting of carboxylic acids, phenols, phosphoric acids, and acid anhydrides, wherein said acid substance is present in the composition in an amount equal to 90 mol % or less based on the base-generating substance (a).

2. The curable composition as claimed in claim 1 which further contains (d) a cross-linking agent containing hydroxy groups selected from the group consisting of silanes which have an average of at least two silanol groups per molecule, silicone polymers which have an average of at least two silanol groups per polymer molecule and water.

3. A method for forming a cured-product pattern corresponding to the negative of a photo-mask, wherein said method comprises
    (A) applying the composition as claimed in claim 2 to a substrate
    (B) placing a photomask between the coating and a radiation source,
    (C) irradiating the coating composition,
    (D) heating the irradiated coating at a temperature of 0° C. to 200° C.,
    (E) dissolving and removing any uncured composition by contacting the coating with a solvent.

4. The method as claimed in claim 3 wherein the coating is applied by spin coating.

5. The method as claimed in claim 3 wherein the coating is heated to a temperature of 100° C. or lower prior to irradiating the coating.

6. The method as claimed in claim 3 wherein the coating is irradiated with ultraviolet light.

7. The curable composition as claimed in claim 1 wherein the base-generating substance is a benzyl carbamate.

8. The curable composition as claimed in claim 1 wherein the base-generating substance is a benzoin carbamate.

9. The curable composition as claimed in claim 1 wherein the base-generating substance is a N-substituted 4-(o-nitrophenyl)dihydropyridine.

10. The curable composition as claimed in claim 1 wherein the base-generating substance is present in an amount of 0.05 to 10 wt % based on the overall weight of the composition.

11. The curable composition as claimed in claim 1 wherein the siloxane polymer is of the general formula $(HRSiO_{2/2})_a(RSiO_{3/2})_b$.

12. The curable composition as claimed in claim 1 wherein the siloxane polymer is of the general formula $(R_2SiO_{2/2})_a(HSiO_{3/2})_b$.

13. The curable composition as claimed in claim 1 wherein the siloxane polymer is of the general formula $(HSiO_{3/2})_b$.

14. The curable composition as claimed in claim 1 wherein the siloxane polymer further contains at least two silanol groups per molecule.

15. The curable composition as claimed in claim 1 wherein there is additionally present a solvent.

16. The curable composition as claimed in claim 1, wherein the siloxane polymer further contains silicon-bonded acetoxy groups and the acid substance is generated in-situ by a reaction of the silicon-bonded acetoxy groups with any water in the atmosphere.

17. A method for forming a cured-product pattern corresponding to the negative of a photo-mask, wherein said method comprises (A) applying the curable composition as claimed in claim 1 to a substrate (B) placing a photomask between the coating and a radiation source (C) irradiating the coating composition, (D) heating the irradiated coating at a temperature of 0° C. to 200° C., (E) dissolving and removing any uncured composition by contacting the coating with a solvent.

18. The method as claimed in claim 17 wherein the coating is applied by spin coating.

19. The method as claimed in claim 17 wherein the coating is irradiated at a temperature of 0° C. to 100° C. in an atmosphere with a relative humidity of 10% or greater.

20. The method as claimed in claim 19 wherein the coating is irradiated for a time sufficient until at least 5% of the base generating substance present in the curable composition has been converted to a base.

21. The method as claimed in claim 17 wherein the coating is irradiated for a time sufficient until at least 5% of the base-generating substance present in the curable composition has been converted to a base.

22. The method as claimed in claim 17 wherein the coating is heated to a temperature of 100° C. or lower prior to irradiating the coating.

23. The method as claimed in claim 17 wherein the coating is irradiated with ultraviolet light.

24. The curable composition as claimed in claim 1 wherein the siloxane is of the general formula $(HSiO_{3/2})_{b'}(RSiO_{3/2})_{b''}$ and $b'+b''=b$.

* * * * *